(12) United States Patent
Cho et al.

(10) Patent No.: US 12,095,055 B2
(45) Date of Patent: Sep. 17, 2024

(54) SENSING ASSEMBLY, MANUFACTURING METHOD FOR THEREOF AND BATTERY MODULE COMPRISING THE SAME

(71) Applicant: SK On Co., Ltd., Seoul (KR)

(72) Inventors: Sei Hoon Cho, Daejeon (KR); Young Ki Kim, Daejeon (KR)

(73) Assignee: SK On Co., Ltd., Seoul (KR)

( * ) Notice: Subject to any disclaimer, the term of this patent is extended or adjusted under 35 U.S.C. 154(b) by 34 days.

(21) Appl. No.: 16/933,136

(22) Filed: Jul. 20, 2020

(65) Prior Publication Data
US 2021/0028513 A1    Jan. 28, 2021

(30) Foreign Application Priority Data

Jul. 23, 2019 (KR) .................. 10-2019-0088645
Jun. 19, 2020 (KR) .................. 10-2020-0074738

(51) Int. Cl.
| | |
|---|---|
| H01M 10/00 | (2006.01) |
| G01R 31/364 | (2019.01) |
| G01R 31/396 | (2019.01) |
| H01M 10/48 | (2006.01) |
| H01M 50/20 | (2021.01) |
| H01M 50/209 | (2021.01) |
| H01M 50/502 | (2021.01) |

(Continued)

(52) U.S. Cl.
CPC ........ *H01M 10/482* (2013.01); *G01R 31/364* (2019.01); *G01R 31/396* (2019.01); *H01M 50/20* (2021.01); *H01M 50/209* (2021.01); *H01M 50/502* (2021.01); *H01M 50/531* (2021.01); *H01M 50/536* (2021.01)

(58) Field of Classification Search
CPC .. H01M 10/482; H01M 50/20; H01M 50/209; H01M 50/502; H01M 50/531; H01M 50/536; H01M 10/425; H01M 10/486; H01M 10/4285; H01M 10/48; G01R 31/364; G01R 31/396; Y02E 60/10; H05K 1/11; H05K 1/147
See application file for complete search history.

(56) References Cited

U.S. PATENT DOCUMENTS

| | | |
|---|---|---|
| 9,024,572 B2 | 5/2015 | Nishihara et al. |
| 2003/0079341 A1 | 5/2003 | Miyake et al. |

(Continued)

FOREIGN PATENT DOCUMENTS

| | | |
|---|---|---|
| JP | 201846297 A | 3/2018 |
| KR | 100659829 B1 | 12/2006 |

(Continued)

OTHER PUBLICATIONS

Machine translation of KR-2037045-B1, obtained Jul. 2023 (Year: 2019).*

(Continued)

*Primary Examiner* — Nicholas P D'Aniello
(74) *Attorney, Agent, or Firm* — The Webb Law Firm (57) ABSTRACT

Provided are a sensing assembly and a battery module including the same, having improved economical efficiency in such a manner that a relatively expensive flexible printed circuit board is used in a smaller amount by allowing a relatively inexpensive rigid printed circuit board to replace a portion of the flexible printed circuit board used for a conventional sensing assembly.

2 Claims, 12 Drawing Sheets

(51) Int. Cl.
  *H01M 50/531*   (2021.01)
  *H01M 50/536*   (2021.01)

(56) References Cited

U.S. PATENT DOCUMENTS

| | | |
|---|---|---|
| 2004/0211057 A1 | 10/2004 | Totani et al. |
| 2009/0214936 A1* | 8/2009 | Yang ................... H01M 10/486 |
| | | 429/61 |
| 2011/0195285 A1* | 8/2011 | Shin ................... H01M 50/296 |
| | | 429/93 |
| 2014/0104776 A1* | 4/2014 | Clayton ................ G06F 1/16 |
| | | 361/749 |
| 2014/0120401 A1 | 5/2014 | Shin et al. |
| 2019/0020012 A1 | 1/2019 | Ju et al. |
| 2020/0037442 A1* | 1/2020 | Keum ................... H05K 1/147 |
| 2022/0085470 A1* | 3/2022 | Cho ................... H01M 50/287 |

FOREIGN PATENT DOCUMENTS

| | | | |
|---|---|---|---|
| KR | 1020120003432 A | 1/2012 | |
| KR | 1020140055918 A | 5/2014 | |
| KR | 1020160065837 A | 6/2016 | |
| KR | 101646994 B1 | 8/2016 | |
| KR | 1020170024918 A | 3/2017 | |
| KR | 1020180022445 A | 3/2018 | |
| KR | 101875538 B1 | 7/2018 | |
| KR | 2037045 B1 * | 10/2019 | ............. B60L 58/10 |
| WO | 2018159928 A1 | 9/2018 | |

OTHER PUBLICATIONS

Machine translation of WO-2020/138869 A1, obtained Oct. 2023 (Year: 2020).*

* cited by examiner

FIG. 1

- Prior art -

- Prior art -

FIG. 4

- Prior art -

SENSING ASSEMBLY, MANUFACTURING METHOD FOR THEREOF AND BATTERY MODULE COMPRISING THE SAME

CROSS-REFERENCE TO RELATED APPLICATIONS

This application claims priority to Korean Patent Application Nos. 10-2019-0088645 and 10-2020-0074738, filed Jul. 23, 2019 and Jun. 19, 2020, respectively, the disclosures of which are hereby incorporated by reference in their entirety.

TECHNICAL FIELD

The following disclosure relates to a sensing assembly, a manufacturing method thereof and a battery module including the same.

BACKGROUND

A rechargeable battery is a device that converts external electrical energy into chemical energy, stores this chemical energy and then generates electricity when needed, and may be used in various fields such as electronic devices using electric power, hybrid vehicles and electric vehicles.

The rechargeable battery may be manufactured in a form of a battery module in which a plurality of battery cells are stacked on each other in one direction. Here, in order to sense a voltage of the battery cells included in the battery module, cell tabs formed on opposite ends of each of the battery cells may be connected to each other using wires. The wires connecting the cell tabs, which are formed on the opposite ends of the battery module, to each other may be very thin, and a separate reinforcement may thus be needed to prevent damage due to its vibration. The reinforcement of the wires needs to have a thickness of at least 3 mm to prevent the damage due to its vibration, which is a factor hindering space utilization of the battery module, and thus needs to be improved.

In order to solve this problem, in a sensing assembly of a conventional battery module, the opposite ends of the battery cell may be connected to each other using a flexible printed circuit board (FPCB) rather than the wires.

Figure 1:
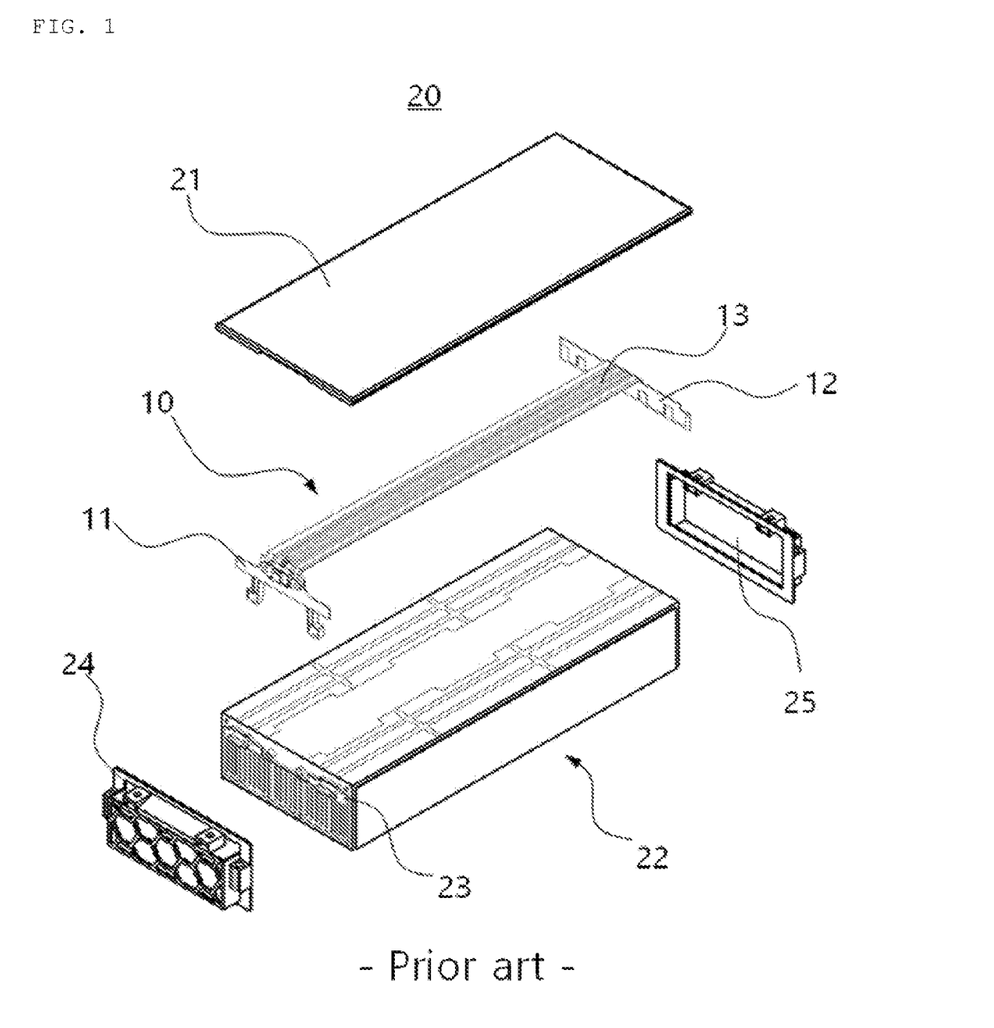
FIG. 1 is an exploded perspective view of a battery module including a conventional sensing assembly.

FIG. 1 shows a disassembled state of a conventional battery module including a sensing assembly using a flexible printed circuit board (FPCB).

As shown in FIG. 1, a battery module 20 including a sensing assembly 10 using the FPCB may include a battery cell stack 22, an upper cover 21, a bus bar coupling member 23, a first side cover 24 and a second side cover 25 in addition to the sensing assembly 10.

The battery cell stack 22 shown in FIG. 1 may have a structure in which battery cells are stacked on each other in one direction and its side surfaces are covered with respective covers. Each battery cell in the battery cell stack 22 may have cell tabs on its opposite ends, and the cell tab formed on each of the opposite ends of the battery cell may be inserted into/protruding from a hole formed in the bus bar coupling member 23. A bus bar may be formed in the bus bar coupling member 23 to connect the cell tabs, which are respectively inserted into/protruding from the holes formed in the bus bar coupling member 23, to each other, and the sensing assembly 10 may be connected to the bus bar of the battery cell stack 22 to measure a voltage of the battery cell.

As shown in FIG. 1, the sensing assembly 10 may include a front member 11 connected to a cell tab protruding from one side of the battery cell stack 22, a rear member 12 connected to a cell tab protruding from the other side of the battery cell stack 22 and a flexible printed circuit board (FPCB) member 13 connecting the front member 11 and the rear member 12 to each other.

Figure 2A:
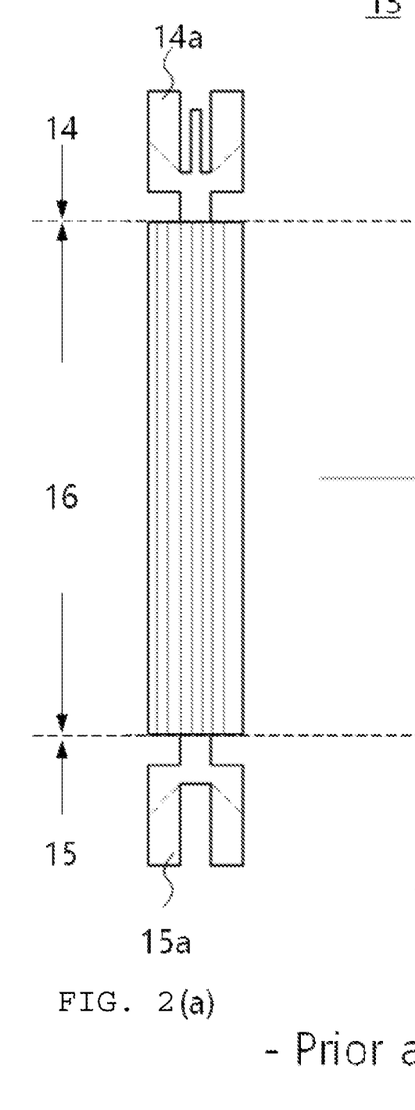
FIGS. 2A and 2B each show a plan view of a flexible printed circuit board (FPCB) member of a sensing assembly shown in FIG. 1.
Figure 2B:
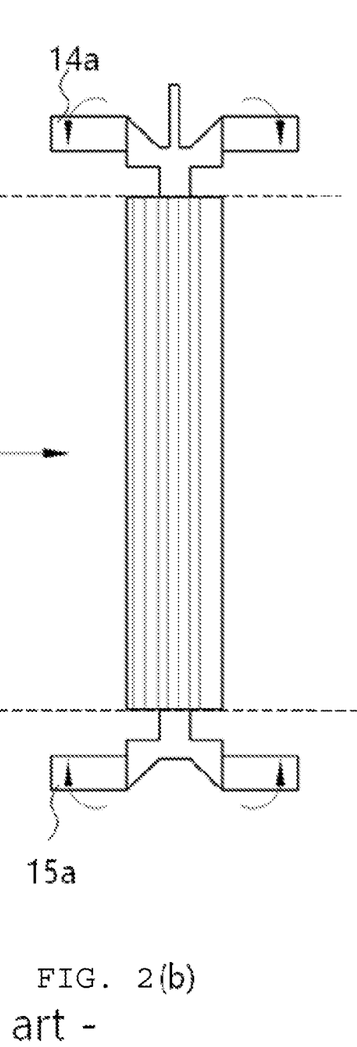

FIGS. 2A and 2B each show only the FPCB member 13 shown in FIG. 1.

The FPCB member 13 may be made of FPCB as its name suggests, and may be a member connecting the front member 11 and the rear member 12, which are included in the sensing assembly 10, to each other, and allowing the sensing assembly 10 to sense the voltage of the battery cell by electrically connecting the cell tabs, which are formed on the opposite ends of the battery cell, to each other. As shown in FIGS. 2A and 2B, the FPCB member 13 may be divided into a front portion 14, a rear portion 15 and a middle portion 16 based on each position of the portions.

FIG. 2A shows a state in which the FPCB member 13 has yet to be used for the sensing assembly 10, and FIG. 2B shows a state in which the FPCB member 13 is used for the sensing assembly 10. As shown in FIGS. 2A and 2B, the front portion 14 and the rear portion 15 of the FPCB member 13 respectively have wider widths than the middle portion 16 in order to be used for the battery cell stack 22. For production efficiency, as shown in FIG. 2A, each of the front portion 14 and the rear portion 15 may be produced to have the same width as the middle portion 16, and a bent portion 14a of the front portion 14 and a bent portion 15a of the rear portion 15 may then be folded along dotted lines and then attached to the front member 11 and the rear member 12 to be used, respectively. Here, a double-sided tape may be used to attach the bent portions to the front member 11 and the rear member 12, respectively.

Figure 3:
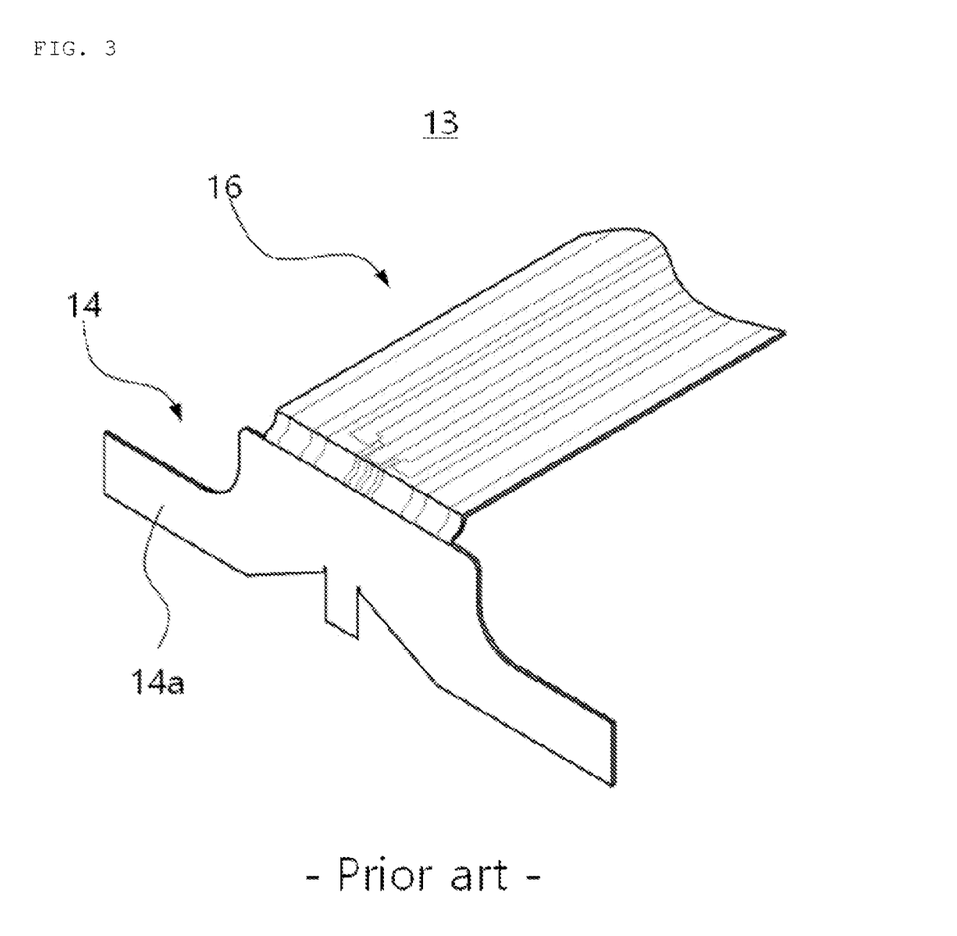
FIG. 3 is a partial enlarged view of the FPCB member of the sensing assembly shown in FIG. 2.

FIG. 3 shows partial enlarged views of the front portion 14 and the middle portion 16 shown in FIGS. 2A and 2B.

As shown in FIG. 3, the middle portion 16 may have a plurality of sensing lines formed thereon to electrically connect the front portion 14 and rear portion 15 to each other. FIG. 3 shows that the sensing lines are formed only on the middle portion 16. Although not shown for convenience, the sensing lines connected to the sensing lines formed on the middle portion 16 may also be formed on each of the front portion 14 and the rear portion 15.

Figure 4:
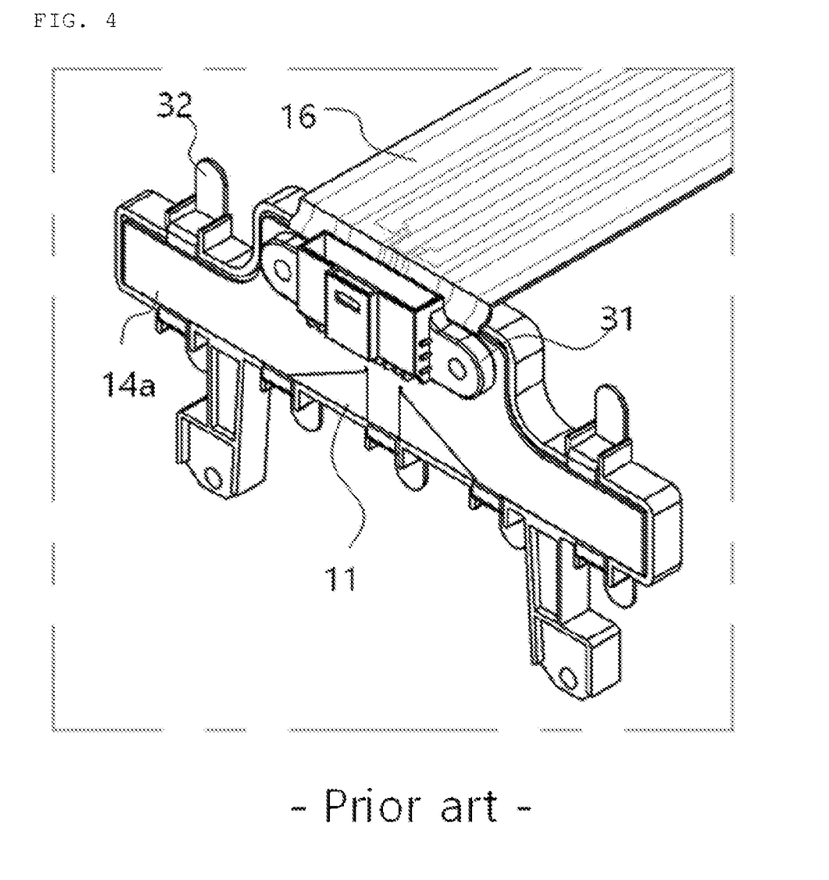
FIG. 4 is a partial enlarged view of the sensing assembly shown in FIG. 1.

FIG. 4 shows a state in which the front portion 14 of the FPCB member 13 shown in FIG. 3 is attached to the front member 11.

The front member 11 shown in FIG. 4 may be made of a sort of synthetic resin injection material. A connector 31 and a sensing leg 32 may be respectively coupled to a front surface of the front member 11, the connector 31 being connected to an outside line to transmit information on the voltage of the battery cell measured through the sensing assembly 10 to the outside, and the sensing leg 32 being welded to the bus bar. The front portion 14 of the FPCB member 13 may be attached to the front surface of the front member 11 in such a manner as shown in FIGS. 2A and 2B. That is, the bent portion 14a of the front portion 14 may be folded, and then the folded bent portion 14a needs to be attached to the front surface of the front member 11 using the double-sided tape. The rear portion of the sensing assembly 10, which is not shown in FIG. 4, may not be coupled to a rear surface of the battery cell stack 22 using the separate synthetic resin injection material. The rear portion of the sensing assembly 10 may be directly attached to the rear surface of the battery cell stack 22 using the double-sided tape after folding the bent portion 15a of the rear portion 15.

It is difficult to automate such a process in which the opposite ends of the above-described FPCB member 13 are folded and then attached to the battery cell stack 22 using the double-sided tape, and therefore this process needs a user's manual work. A product quality may thus depend on a worker's skill level because the process is manually performed by the worker. In particular, the bent portion 14a needs to be attached to allow the sensing line formed on the bent portion 14a to be connected to a terminal or the sensing leg formed on the front member 11. However, the attachment process is manually performed, and it may thus be difficult to attach the bent portion 14a to its correct position. In addition, in case that an error occurs in which the bent portions 14a and 15a are incorrectly folded, none of the sensing lines formed on the bent portion may be connected to the terminal or the sensing leg, and a relatively expensive FPCB may be used in a large amount, thereby increasing a production cost.

RELATED ART DOCUMENT

Patent Document

KR 2018-0022445 A

SUMMARY

An embodiment of the present disclosure is directed to providing a sensing assembly, a manufacturing method thereof and a battery module including the same, in which the sensing assembly used for the battery module is easily assembled and economically efficient by changing its manufacturing process to be automated, and also economically efficient by allowing a relatively expensive flexible printed circuit board to be used in a smaller amount.

In one general aspect, a sensing assembly includes: a first substrate made of a rigid printed circuit board and including at least one first terminal formed on its one surface; a second substrate made of a flexible printed circuit board and including at least one sensing line electrically bonded to the first terminal; and a first electrical bonding portion formed between one end of the second substrate and the first substrate to electrically bond the sensing line and the first terminal to each other.

In addition, the first electrical bonding portion may be a soldering portion formed using soldering.

In addition, the first electrical bonding portion may be a bonding portion formed using an electroconductive film.

In addition, the first electrical bonding portion may be a welding portion formed using ultrasonic welding or laser welding.

In addition, the first substrate may further include a second terminal formed on its one surface, the sensing assembly may further include: a sensing leg having one end electrically bonded to the second terminal; and a second electrical bonding portion formed on the one surface of the first substrate to electrically bond the second terminal and the sensing leg to each other.

In addition, the second electrical bonding portion may be a soldering portion formed using the soldering.

In addition, the second electrical bonding portion may be a bonding portion formed using the electroconductive film.

In addition, the second electrical bonding portion may be a welding portion formed using the ultrasonic welding or the laser welding.

In another general aspect, a battery module includes: a battery cell stack including a plurality of battery cells stacked on each other in one direction; a bus bar coupling member coupled to opposite ends of the battery cell stack and having cell tabs of each of the battery cells, the cell tabs each being inserted into and exposed to the outside of the bus bar coupling member; and a sensing assembly electrically connected to the cell tabs exposed to the outside of the bus bar coupling member to sense a voltage of the battery cell, wherein the sensing assembly includes: a first substrate made of a rigid printed circuit board and including at least one first terminal formed on its one surface; a second substrate made of a flexible printed circuit board and including at least one sensing line electrically bonded to the first terminal; and a first electrical bonding portion formed between one end of the second substrate and the first substrate to electrically bond the sensing line and the first terminal to each other.

In addition, the first electrical bonding portion may be a soldering portion formed using the soldering.

In addition, the first electrical bonding portion may be a bonding portion formed using the electroconductive film.

In addition, the first electrical bonding portion may be a welding portion formed using the ultrasonic welding or the laser welding.

In addition, the first substrate may further include: a second terminal formed on its one surface; a sensing leg having one end electrically bonded to the second terminal; and a second electrical bonding portion formed on the one surface of the first substrate to electrically bond the second terminal and the sensing leg to each other.

In addition, the second electrical bonding portion may be a soldering portion formed using the soldering.

In addition, the second electrical bonding portion may be a bonding portion formed using the electroconductive film.

In addition, the second electrical bonding portion may be a welding portion formed using the ultrasonic welding or the laser welding.

In another general aspect, a manufacturing method of a sensing assembly includes: a step A of preparing a first substrate made of a rigid printed circuit board and including at least one first terminal formed on its one surface; and a step B of disposing one end of a second substrate on the one surface of the first substrate and forming a first electrical bonding portion on the one surface of the first substrate, the second substrate including at least one sensing line and made of a flexible printed circuit board, and the first electrical bonding portion electrically bonding the sensing line and the first terminal to each other.

In addition, in the step B, the first electrical bonding portion may be a soldering portion formed by soldering the sensing line and the first terminal to each other.

In addition, in the step B, the first electrical bonding portion may be a bonding portion formed by bonding the sensing line and the first terminal to each other using an electroconductive film.

In addition, in the step B, the bonding portion may be formed by: disposing the electroconductive film between the first terminal and the sensing line; and pressurizing and heating the first terminal, the electroconductive film and the sensing line, sequentially stacked on one another, using a heating means.

In addition, in the step B, the first electrical bonding portion may be a welding portion formed by welding the sensing line and the first terminal to each other using ultrasonic welding or laser welding.

In addition, the manufacturing method of a sensing assembly, wherein the first substrate further includes a second terminal formed on its one surface, and the manufacturing method may further include a step C of forming a second electrical bonding portion electrically bonding one end of the sensing leg and the second terminal to each other.

In addition, in the step C, the second electrical bonding portion may be a soldering portion formed by soldering the one end of the sensing leg and the second terminal to each other using the soldering.

In addition, in the step C, the second electrical bonding portion may be a bonding portion formed by bonding the one end of the sensing leg and the second terminal to each other using the electroconductive film.

In addition, in the step C, the bonding portion may be formed by: disposing the electroconductive film between the second terminal and the sensing leg; and pressurizing and heating the second terminal, the electroconductive film and the sensing leg, sequentially stacked on one another, using a heating means.

In addition, in the step C, the second electrical bonding portion may be a welding portion formed by welding the sensing leg and the second terminal to each other using the ultrasonic welding or the laser welding.

Other features and aspects are apparent from the following detailed description, the drawings and the claims.

DETAILED DESCRIPTION OF EMBODIMENTS

Hereinafter, a sensing assembly and a battery module including the same according to embodiments of the present disclosure are described in detail with reference to the accompanying drawings. The accompanying drawings are provided by way of example to sufficiently transfer the idea of the present disclosure to those skilled in the art to which the present disclosure pertains. Therefore, the present disclosure is not limited to the drawings to be provided below, but may be implemented in other forms.

Figure 5:
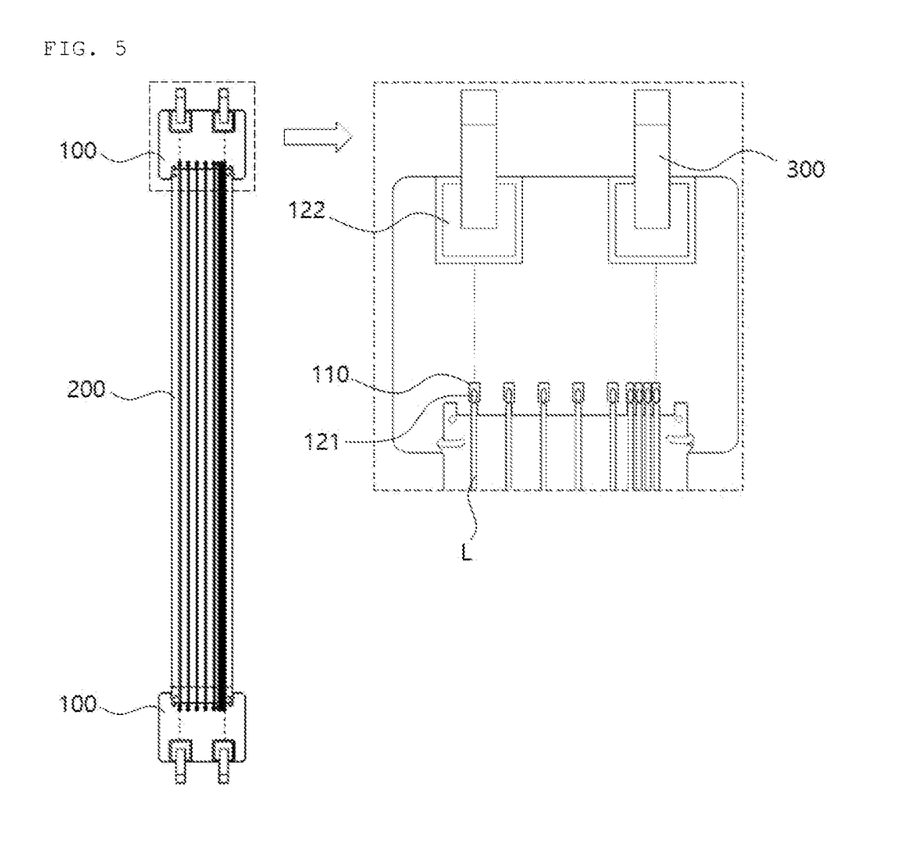
FIG. 5 is a plan view of a sensing assembly according to an embodiment of the present disclosure.

FIG. 5 is a schematic plane view of a sensing assembly according to an embodiment of the present disclosure.

As shown in FIG. 5, the sensing assembly according to an embodiment of the present disclosure may include: a first substrate 100; a second substrate 200; and a sensing leg 300.

A pair of first substrates 100 may be disposed to be spaced apart from each other, and made of a rigid printed circuit board (hereinafter, RPCB). As indicated by a dotted line in FIG. 5, a circuit for electrically connecting the second substrate 200 and the sensing leg 300 to each other, which is described below, may be printed on or in the first substrate 100, and the pair of first substrates 100 may be coupled to front and rear surfaces of a battery cell stack, respectively.

The first substrate 100 may include a first terminal 121 and a second terminal 122 formed on its one surface (shown in FIG. 5). The first terminal 121 may be electrically bonded to the second substrate 200 to be described below, and the second terminal 122 may be electrically bonded to the sensing leg 300 to be described below.

The pair of first substrates 100, which are respectively coupled to the front and rear surfaces of the battery cell stack, may generally be made of a printed circuit board (PCB). The reason is that the first substrate 100 made of the rigid printed circuit board (RPCB) may replace a portion of a flexible printed circuit board (FPCB) used for the conventional sensing assembly described in the background and the FPCB may thus be used in a smaller amount, thereby reducing a production cost.

As shown in FIG. 5, the second substrate 200 may connect the pair of first substrates 100 disposed to be spaced apart from each other. Unlike the first substrate 100, the second substrate 200 may be made of the flexible printed circuit board (FPCB). The reason why the second substrate 200 may be made of the FPCB is to improve the space utilization of the battery module as described in the background, and to enable the sensing assembly to be manufactured without damaging the second substrate 200 or other members even if an assembly error occurs within an allowable range.

As shown in FIG. 5, sensing lines L may be formed on the second substrate 200, and each sensing line L may be formed from one end to the other end of the second substrate 200.

As shown in FIG. 5, the one end of the second substrate 200 may be disposed on the one surface of the first substrate 100. That is, the one end of the second substrate 200 may be disposed on the one surface of the first substrate 100 to allow the one surface of the first substrate 100 and one surface (adjacent to the first substrate 100) of the second substrate 200 to be in surface contact with each other. The reason why the one surface of the first substrate 100 and the one surface of the second substrate 200 are in surface contact with each other is to improve a coupling force between the first substrate 100 and the second substrate 200 when the first substrate 100 and the second substrate 200 are electrically bonded to each other. As described above, the first terminal 121 connected to the sensing line L of the second substrate 200 may be formed on the one surface of the first substrate 100; the one end of the second substrate 200 may be disposed on the one surface of the first substrate 100 for the second substrate 200 to be connected to the first terminal 121 of the first substrate 100; and the first terminal 121 and the sensing line L may then be electrically bonded to each other through a first electrical bonding portion. The first electrical bonding portion in an embodiment of the present disclosure may be a soldering portion 110 formed using soldering.

The RPCB and the FPCB may conventionally be used together. However, the FPCB and the RPCB may be used together in such a manner that: connectors are conventionally respectively formed on the RPCB and the FPCB; and the connectors respectively formed on the RPCB and the FPCB are connected to each other. This method may further include processes in which the connector and the RPCB are electrically bonded to each other and the connector and the FPCB are electrically bonded to each other. Therefore, this method may have a higher production cost than that shown in an embodiment of the present disclosure.

On the contrary, the first substrate 100 and the second substrate 200 in this embodiment may be directly connected to each other using the soldering without any separate connector, thereby having a lower production cost than the conventional method described above, and a simplified production process. The following is a method of forming the soldering portion 110 using the soldering: the second substrate 200 may be disposed on the one surface of the first substrate 100 to allow the first terminal 121 and the sensing line L to come into contact with each other; solder paste may then be applied to a portion where the first terminal 121 and the sensing line L are in contact with each other; and the first substrate 100 and the second substrate 200 may then be exposed in a heated space, such as an oven, for a predetermined time or hot air may then be applied to the portion where the solder paste is applied. This method may simultaneously enable the soldering portions 110 to be formed on a plurality of first substrates 100 and second substrates 200, thereby improving mass productivity.

In the present disclosure, the soldering method described above may not be the only method of connecting the first terminal 121 and the sensing line L to each other. Another method may also be used to form the first electrical bonding portion by electrically bonding the first terminal 121 and the sensing line L to each other, that is, a bonding portion may be formed using an electroconductive film, or a welding portion may be formed using ultrasonic welding or laser welding. Here, the electroconductive film may refer to a film capable of electrically connecting two members to which the film is attached to each other. An example of the electroconductive film may be an anisotropic conductive film (hereinafter, ACF). The ACF may electrically bond two different members to each other in the following manner: the ACF is disposed between the two members which need to be electrically bonded to each other; the two stacked members and the ACF disposed therebetween are then pressurized and heated; and the bonding portion is then formed as the first electrical bonding portion. Details on how to use the ACF in the present disclosure are described below.

Figure 6:
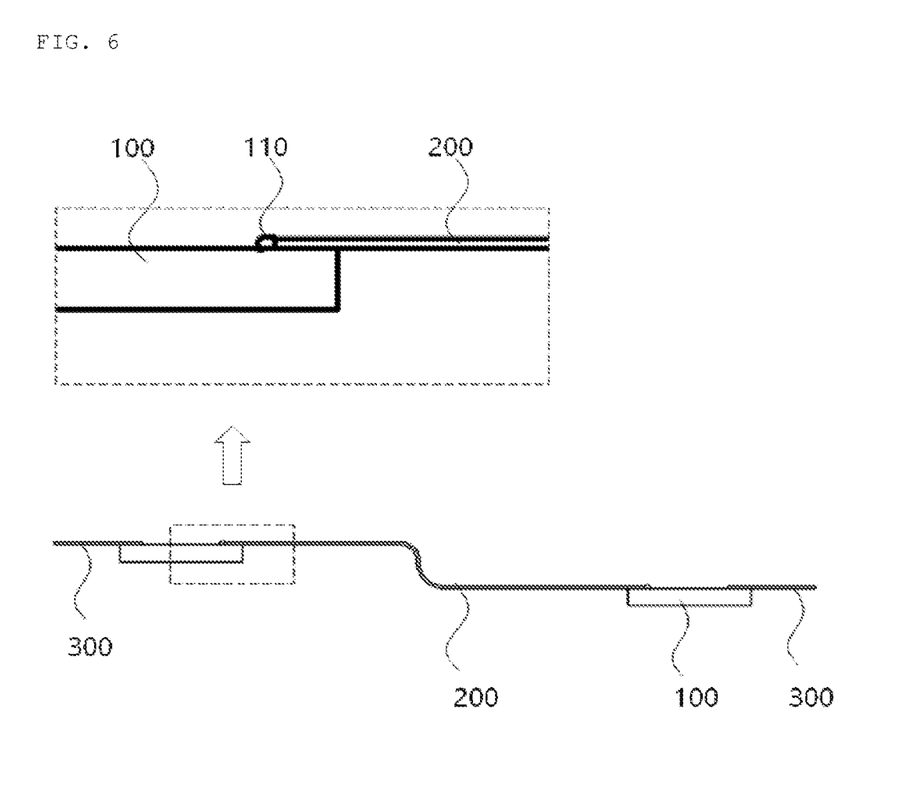
FIG. 6 is a side view showing a state in which a second substrate of the sensing assembly is bent according to an embodiment of the present disclosure.

FIG. 6 schematically shows a side of the sensing assembly according to an embodiment of the present disclosure shown in FIG. 5.

As shown in FIG. 6, the second substrate 200 included in the sensing assembly according to an embodiment of the present disclosure may be made of the FPCB and thus be able to be flexibly bent or folded. Therefore, when using the sensing assembly in the battery cell stack, stress may not be concentrated on the second substrate 200 even if the assembly error occurs. It may thus be easy to use the sensing assembly in the battery cell stack without worrying about damage to the second substrate 200 or other members.

As shown in FIG. 5, one end of the sensing leg 300 may be electrically bonded to the second terminal 122 formed on the one surface of the first substrate 100 through a second electrical bonding portion. Here, the sensing leg 300 may be a terminal capable of sensing the voltage or temperature of the battery cell, and may be referred to as a sensing terminal, a sensing port, etc. In addition, when included in the battery module, the sensing leg 300 may be configured to be coupled to the bus bar sensing the voltage of the battery cell. The second electrical bonding portion, which electrically bonds the sensing leg 300 and the second terminal 122 to each other, may be a soldering portion formed using the soldering. This method may be the same as the method of forming the first electrical bonding portion of this embodiment, which is formed between the first substrate 100 and the second substrate 200. In the present disclosure, however, the soldering method may not be the only method of electrically bonding the sensing leg 300 and the second terminal of the first substrate 100 to each other. Another method may also be used, that is, the bonding portion may be formed using the electroconductive film or the welding portion may be formed using the ultrasonic welding or the laser welding. One surface of the sensing leg 300 and the one surface of the first substrate 100 may also come into surface contact with each other, and may be electrically bonded to each other by forming the second electrical bonding portion using at least one of the soldering, the electroconductive film, the ultrasonic welding and the laser welding to increase a coupling force between the sensing leg 300 and the first substrate 100.

In the present disclosure, the sensing lines formed on the second substrate 200, the first terminal 121 and the second terminal 122 which are formed on the first substrate 100, and the sensing leg 300 may be electrically connected to one another, and the voltage and temperature of the battery cell may be sensed through this electrical connection.

In this embodiment, the sensing leg 300 may be made of the FPCB like the second substrate 200. However, the sensing leg 300 in the present disclosure is not limited to the FPCB and may be made of the RPCB, or may be made of another shape or material.

The one end of the sensing leg 300 may be electrically connected to the sensing line L of the second substrate 200 through a printed circuit on or in the first substrate 100. The other end of the sensing leg 300 may be connected to the bus bar using the welding. Here, there may be a process to be shared to some extent for the welding method of connecting the other end of the sensing leg 300 and the bus bar to each other and the soldering method of connecting the first substrate 100 and the second substrate 200 to each other or coupling the sensing leg 300 to the first substrate 100, thereby improving convenience and economical efficiency in manufacturing the sensing assembly according to an embodiment of the present disclosure.

In the present disclosure, another method rather than the soldering may be used to electrically bond the first substrate 100 and the second substrate 200 to each other. Even in this case, the another method of electrically bonding the first substrate 100 and the sensing leg 300 to each other may also be the same as the method of electrically bonding the first substrate 100 and the second substrate 200 to each other. Therefore, even using the another method rather than the soldering may also improve convenience and economical efficiency in manufacturing the sensing assembly according to an embodiment of the present disclosure.

The reason why the sensing leg 300 may be made of the FPCB is that as in the case of the second substrate 200, even if the assembly error occurs when the sensing assembly is coupled to the battery module, the sensing assembly may be easily assembled without the stress being concentrated on the sensing leg 300 as long as the assembly error is within the allowable range.

Figure 7A:
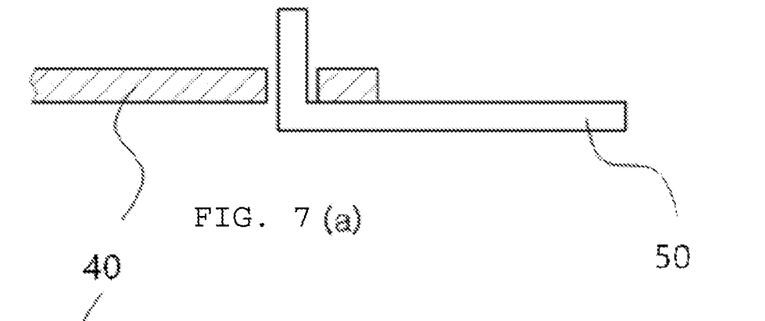
FIGS. 7A to 7C are respective schematic side views of sensing legs of the sensing assemblies, according to the prior art and an embodiment of the present disclosure.
Figure 7B:
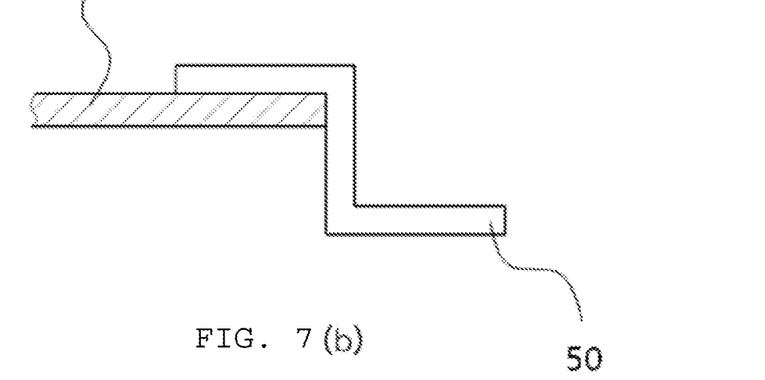
Figure 7C:
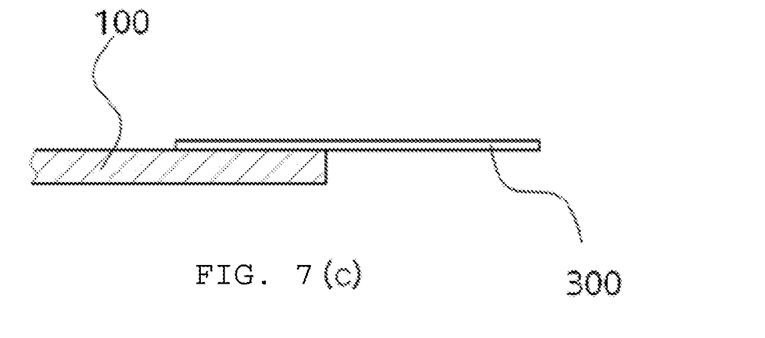

To describe the reason why the sensing leg 300 may be made of the FPCB in more detail, FIGS. 7A and 7B schematically show two methods in which each conventional sensing leg is coupled to a substrate, and FIG. 7C schematically shows a method in which the sensing leg is coupled to the sensing assembly according to an embodiment of the present disclosure. FIGS. 7A and 7B each show a conventional method, and FIG. 7C shows a method of the present embodiment.

First, FIG. 7A shows a method in which a hole is machined in a rigid printed circuit board (RPCB) 40, one end of a metal sensing leg 50 made of metal is then inserted into the hole, thereby electrically connecting a printed circuit of the RPCB 40 and the metal sensing leg 50 to each other using the soldering. Here, the metal sensing leg 50 may generally be made of copper. However, the method shown in FIG. 7A may require a process of forming a separate hole in the RPCB 40, and when an assembly error occurs, stress may be exerted on the metal sensing leg 50 and cause damage to the metal sensing leg 50. In addition, the metal sensing leg 50 may generally be manufactured using a mold. In order to use a sensing assembly for a battery cell stack having a different specification, the metal sensing leg 50 used for each battery cell stack also needs to be manufactured to have a different specification, which requires a mold of various specifications. A high cost may generally be required to make a new mold, and thus the metal sensing leg 50 manufactured by the method shown in FIG. 7A may have low economical efficiency and may not be used extensively.

FIG. 7B shows a method of connecting the metal sensing leg 50 to the RPCB 40 using the soldering after disposing the metal sensing leg 50 on the RPCB 40 without machining a hole in the RPCB 40. The method shown in FIG. 7B omits the process of machining the hole in the RPCB 40, thereby improving manufacturing convenience and economical efficiency when compared to the method shown in FIG. 7A. However, like the method shown in FIG. 7A, the method shown in FIG. 7B may cause damage to the metal sensing leg 50 due to the assembly error, and also may not be used extensively.

On the contrary, FIG. 7C shows the sensing leg 300 of the present disclosure, made of the FPCB rather than a metal such as copper. Therefore, the sensing leg 300 may be used for a battery module including a battery cell stack of various specifications as long as the sensing leg 300 has a predetermined length or more. Even if the assembly error occurs, no stress (or stress of a predetermined level or less) may be exerted on the sensing leg 300, and the sensing leg 300 may thus have a low possibility of damage and may be easily assembled to the battery cell stack.

Figure 8:
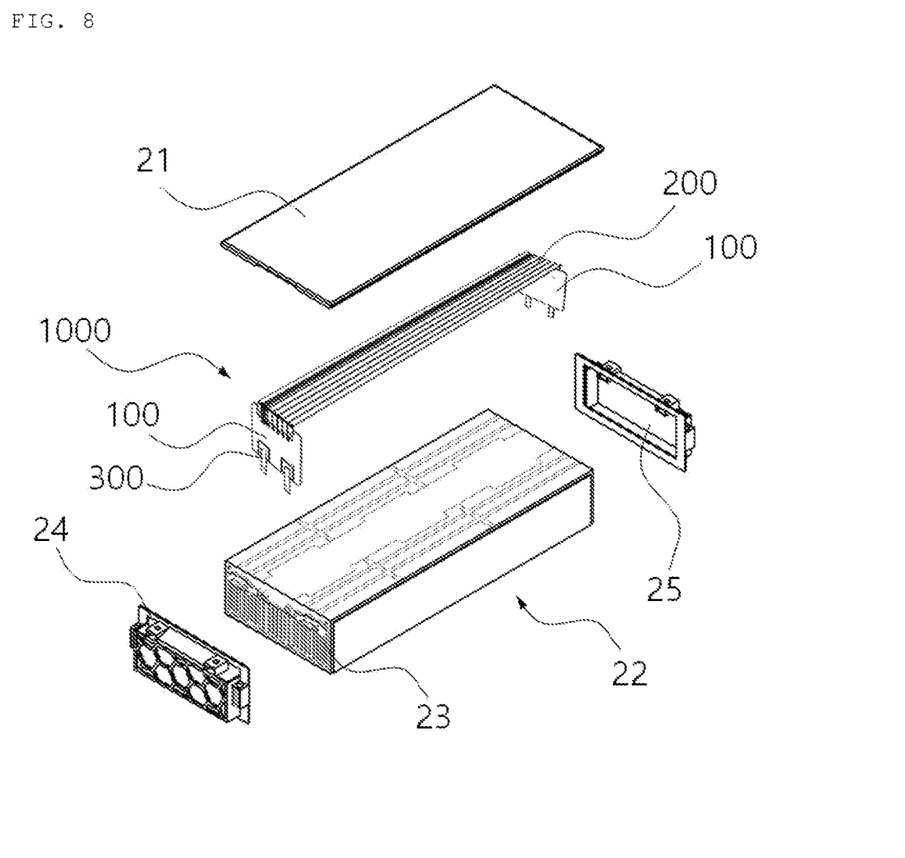
FIG. 8 is an exploded perspective view of a battery module including the sensing assembly according to an embodiment of the present disclosure.

FIG. 8 is an exploded perspective view of a battery module according to an embodiment of the present disclosure.

As shown in FIG. 8, the battery module according to an embodiment of the present disclosure may include: a battery cell stack 22; a bus bar coupling member 23; and a sensing assembly 1000. In addition, the battery module may further include a top cover 21, a first side cover 24 and a second side cover 25. Among the above-mentioned components, the sensing assembly 1000 is the same as the sensing assembly of the present disclosure described above. Therefore, the sensing assembly 1000 may include the first substrate 100, the second substrate 200 and the sensing leg 300. A detailed description of the sensing assembly 1000 is thus omitted. Among the components included in the battery module according to an embodiment of the present disclosure, the other components except for the sensing assembly 1000 are the same as those described in the background of the present disclosure.

Hereinafter, a manufacturing method of a sensing assembly according to an embodiment of the present disclosure is described in detail with reference to the accompanying drawings.

The manufacturing method of the sensing assembly according to an embodiment of the present disclosure may include a step A and a step B. In the step A, a pair of first substrates 100 each having at least one first terminal 121 on its one surface, may be disposed to be spaced apart from each other. In the step B, a second substrate having a sensing line L formed thereon and made of a flexible printed circuit board may be disposed between the first substrates 100, and the sensing line L and the first terminal 121 may be electrically bonded to each other to form a first electrical bonding portion.

As described above, the first electrical bonding portion may be formed using various methods such as soldering, an electroconductive film, ultrasonic welding and laser welding to electrically bond the sensing line L and the first terminal 121 to each other. The above description already describes the method of electrically bonding the sensing line L and the first terminal 121 to each other using the soldering, and a description of this embodiment thus focuses on a bonding method using an anisotropic conductive film (ACF), which is a sort of the electroconductive film.

Figure 9:
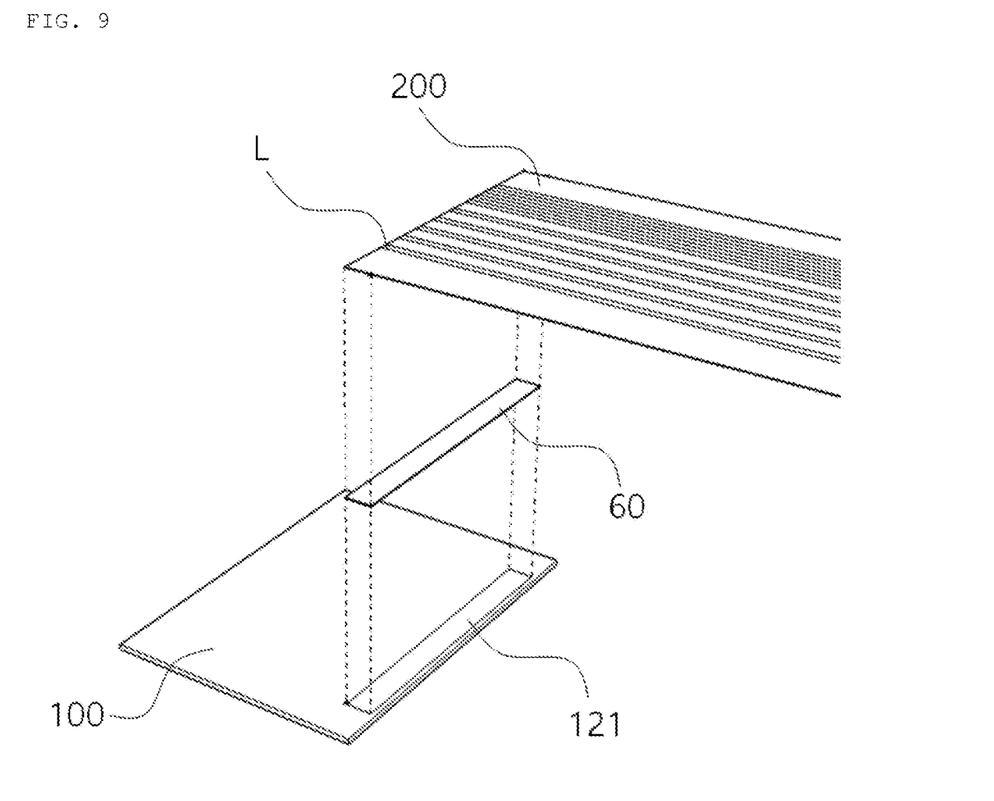
FIGS. 9 and 10 are schematic views of a step B in a manufacturing method of the sensing assembly according to an embodiment of the present disclosure.
Figure 10:
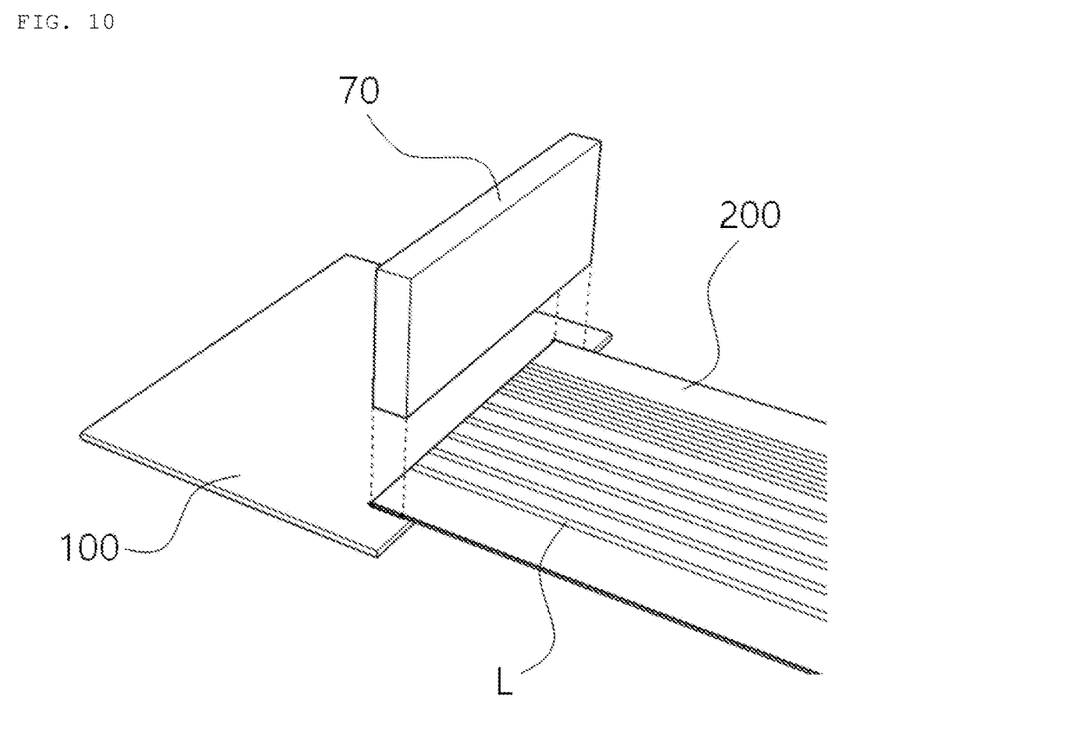

FIG. 9 shows a state of the step B in which an anisotropic conductive film (ACF) 60 is disposed between the first substrate 100 having the first terminal 121 formed thereon and a second substrate 200 having the sensing line L formed thereon. In the step B of this embodiment, the first terminal 121 and the sensing line L may then be electrically bonded to each other by: sequentially stacking the first substrate 100, the ACF 60 and the second substrate 200, which are shown in FIG. 9, to implement a state shown in FIG. 10; then moving a bar-shaped heating means 70 to come into surface contact with the stacked portions; and pressurizing the stacked portions with a pressure of a predetermined level or more and simultaneously heating the stacked portions to form a bonding portion formed of the ACF 60. That is, the bonding portion formed of the ACF 60 may be the first electrical bonding portion of this embodiment. As described above, the electrical bonding method using the ACF 60 may be advantageous in being performed in a relatively small space by having the miniaturized heating means 70.

The manufacturing method of the sensing assembly according to an embodiment of the present disclosure may further include a step C.

Figure 11:
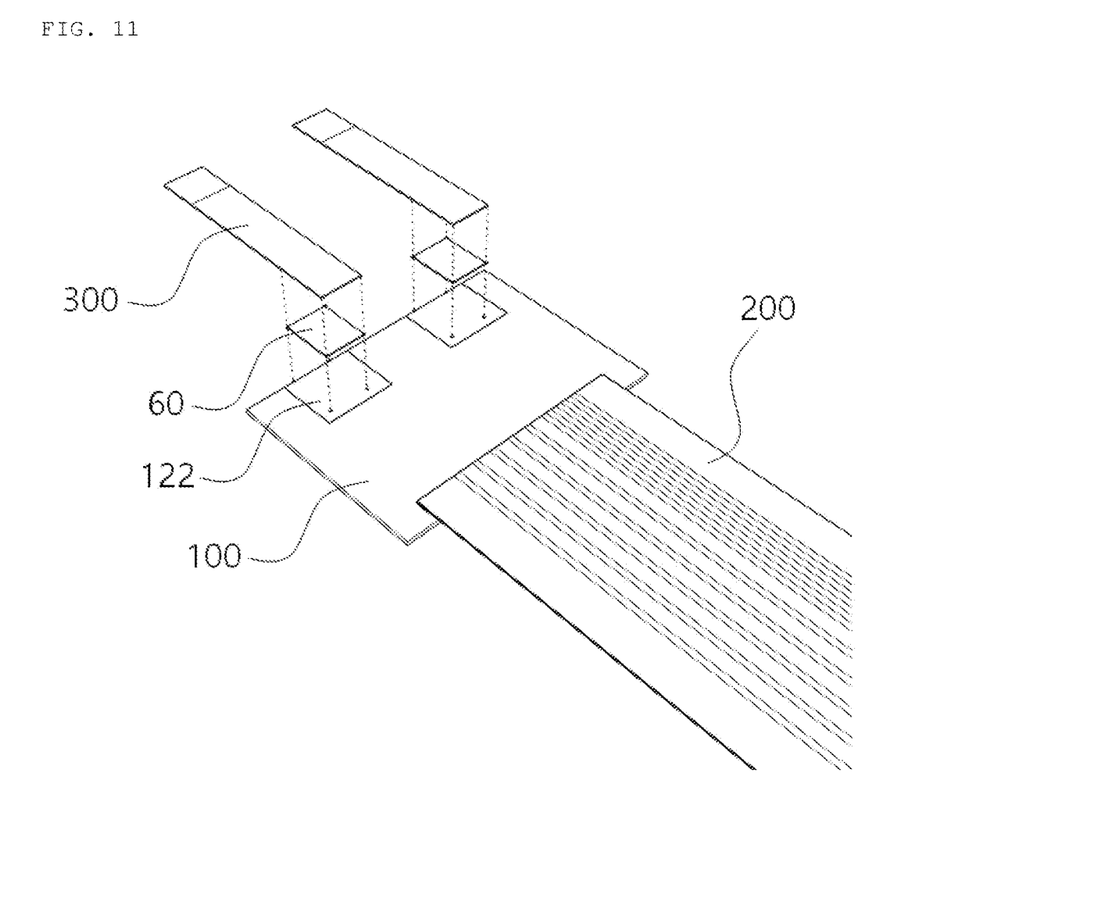
FIGS. 11 and 12 are schematic views of a step C in the manufacturing method of the sensing assembly according to an embodiment of the present disclosure.
Figure 12:
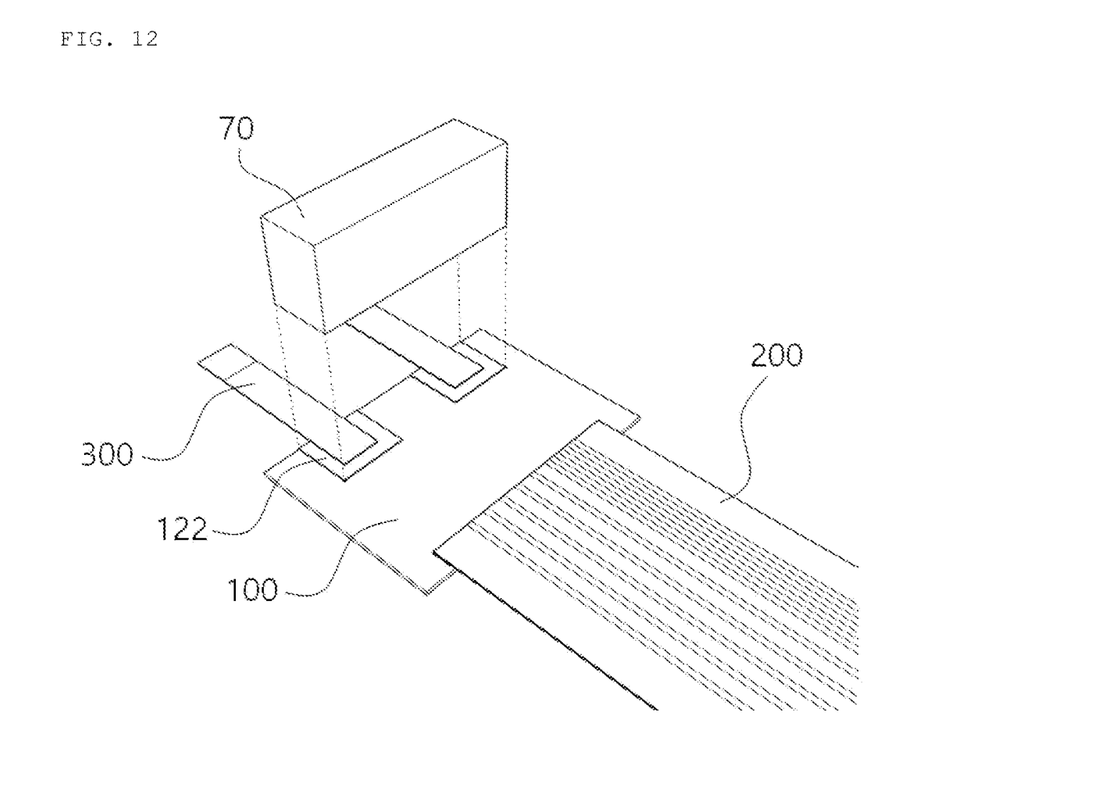

FIGS. 11 and 12 each sequentially show a process to perform the step C in the manufacturing method of the sensing assembly according to an embodiment of the present disclosure.

As shown in FIG. 11, in the step C, one end of a sensing leg 300 made of a flexible printed circuit board (FPCB) and the first substrate 100 may first be spaced apart from each other, and the ACF 60 may be disposed between a second terminal 122 formed on the one surface of the first substrate 100 and the sensing leg 300. FIG. 12 shows a state in which the second terminal 122, the ACF 60 and the sensing leg 300 are sequentially stacked on one another. Then, in the step C, the bonding portion may be formed by pressurizing and simultaneously heating the second terminal 122, the ACF 60 and the sensing leg 300, which are sequentially stacked on one another, at a pressure of a predetermined level or more using the heating means 70. The bonding portion formed in the above-described process may become a second electrical bonding portion electrically bonding the second terminal 122 and the sensing leg 300 to each other. However, the above-described embodiment may not be the only process of forming the second electrical bonding portion in the step C of the present disclosure. In the step C, as in the step B of forming the first electrical bonding portion, the second electrical bonding portion may be a soldering portion using the soldering or a welding portion using the ultrasonic welding or the laser welding.

The step C may be performed regardless of the order of the step A and the step B, which are described above. That is, the first substrate 100 and the second substrate 200 may be electrically bonded to each other after the sensing leg 300 and the first substrate 100 are electrically bonded to each other.

According to the sensing assembly, the manufacturing method thereof and the battery module including the same, of the present disclosure as described above, the sensing assembly and the battery module including the same may have improved economical efficiency in such a manner that the relatively expensive flexible printed circuit board (FPCB) is used in a smaller amount by allowing the relatively inexpensive rigid printed circuit board (RPCB) to replace a portion of the flexible printed circuit board used for the conventional sensing assembly.

In addition, the sensing assembly of the present disclosure may have improved manufacturing convenience and further improved economical efficiency by electrically bonding the first substrate made of the RPCB and the second substrate made of the FPCB to each other using one of the soldering, the electroconductive film, the ultrasonic welding and the laser welding, and also by electrically bonding the first substrate and the sensing leg to each other using the same method sharing some of the process.

In addition, according to the present disclosure, due to the sensing leg made of the FPCB, the sensing assembly of the present disclosure may be used for the battery modules of various specifications, may have the improved assembly convenience and may be manufactured in such a manner that the stress is not concentrated on the sensing leg even if the assembly error occurs within the allowable range.

Hereinabove, the present disclosure is described by specific exemplary embodiments and the accompanying drawings. However, the present disclosure is not limited to the abovementioned exemplary embodiments. Various modifications and changes may be made by those skilled in the art to which the present disclosure pertains from this description. Therefore, the spirit of the present disclosure needs to be understood by the claims and all of modifications equal or equivalent to the claims are intended to fall within the scope and spirit of the present disclosure.

What is claimed is:

1. A sensing assembly coupling both ends of a battery cell stack, the sensing assembly comprising:
    two first substrates respectively coupled to both ends of the battery ends of the battery cell stack;
    a second substrate including sensing lines crossing the battery cell stack and coupling the first substrates respectively coupled to both ends of the battery cell stack; and
    first electrical bonding portions formed between each of the first substrates and the second substrate and coupling the first substrates and the second substrate,
    wherein the first substrates are made of a rigid printed circuit board and include:
        at least one first terminal at a first end of each first substrate electrically bonded to one of the sensing lines on one surface of the at least one first terminal,
        a second terminal at a second end of each first substrate,
        a sensing leg having one end electrically bonded to the second terminal, and
        a second electrical bonding portion at the second end of each first substrate to electrically bond the second terminal and the sensing leg to each other,
    wherein the second substrate and the sensing leg of each first substrate are made of a flexible printed circuit board, and
    wherein at least one of the first electrical bonding portions and the second electrical bonding portion are formed using an electroconductive film.

2. A battery module comprising:
    a battery cell stack including a plurality of battery cells stacked on each other in one direction;
    a bus bar coupling member coupled to opposite ends of the battery cell stack and having cell tabs of each of the battery cells, the cell tabs each being inserted into and exposed to the outside of the bus bar coupling member; and
    a sensing assembly electrically connected to the cell tabs exposed to the outside of each of the bus bar coupling member to sense a voltage of the battery cell,
    wherein the sensing assembly includes:
        two first substrates respectively coupled to both ends of the battery ends of the battery cell stack;
        a second substrate including sensing lines crossing the battery cell stack and coupling the first substrates respectively coupled to both ends of the battery cell stack; and
        first electrical bonding portions formed between each of the first substrates and the second substrate and coupling the first substrates and the second substrate,
    wherein the first substrates are made of a rigid printed circuit board and include:
        at least one first terminal at a first end of each first substrate electrically bonded to one of the sensing lines on one surface of the at least one first terminal,
        a second terminal at a second end of each first substrate, and
        a sensing leg having one end electrically bonded to the second terminal, and
        a second electrical bonding portion at the second end of each first substrate to electrically bond the second terminal and the sensing leg to each other,
    wherein the second substrate and the sensing leg of each first substrate are made of a flexible printed circuit board, and
    wherein at least one of the first electrical bonding portion and the second electrical bonding portion are formed using an electroconductive film.

* * * * *

UNITED STATES PATENT AND TRADEMARK OFFICE
CERTIFICATE OF CORRECTION

PATENT NO. : 12,095,055 B2  
APPLICATION NO. : 16/933136  
DATED : September 17, 2024  
INVENTOR(S) : Sei Hoon Cho et al.

Page 1 of 1

It is certified that error appears in the above-identified patent and that said Letters Patent is hereby corrected as shown below:

On the Title Page

Column 1, Item (54), Line 2, delete "METHOD FOR THEREOF" and insert -- METHOD THEREOF --

In the Specification

Column 1, Lines 1-3, delete "METHOD FOR THEREOF" and insert -- METHOD THEREOF --

Signed and Sealed this  
Tenth Day of December, 2024

Katherine Kelly Vidal  
*Director of the United States Patent and Trademark Office*